United States Patent
Taguchi

(10) Patent No.: US 10,441,937 B2
(45) Date of Patent: Oct. 15, 2019

(54) LIGHT IRRADIATION DEVICE AND LIGHT IRRADIATION SYSTEM

(71) Applicant: KYOCERA Corporation, Kyoto-shi, Kyoto (JP)

(72) Inventor: Akira Taguchi, Yasu (JP)

(73) Assignee: KYOCERA CORPORATION, Kyoto-Shi, Kyoto (JP)

(*) Notice: Subject to any disclaimer, the term of this patent is extended or adjusted under 35 U.S.C. 154(b) by 0 days.

(21) Appl. No.: 15/767,216

(22) PCT Filed: Oct. 28, 2016

(86) PCT No.: PCT/JP2016/082187
§ 371 (c)(1),
(2) Date: Apr. 10, 2018

(87) PCT Pub. No.: WO2017/073776
PCT Pub. Date: May 4, 2017

(65) Prior Publication Data
US 2019/0070577 A1 Mar. 7, 2019

(30) Foreign Application Priority Data

Oct. 29, 2015 (JP) .................................. 2015-213216

(51) Int. Cl.
| | |
|---|---|
| B41J 2/447 | (2006.01) |
| B41J 11/00 | (2006.01) |
| B01J 19/12 | (2006.01) |
| B29C 35/08 | (2006.01) |
| B41J 2/01 | (2006.01) |
| H01L 31/12 | (2006.01) |
| H01L 33/48 | (2010.01) |

(52) U.S. Cl.
CPC ............... *B01J 19/12* (2013.01); *B29C 35/08* (2013.01); *B41J 2/01* (2013.01); *B41J 2/447* (2013.01); *B41J 11/002* (2013.01); *H01L 31/12* (2013.01); *H01L 33/48* (2013.01); *B29C 2035/0827* (2013.01)

(58) Field of Classification Search
CPC ................................. B41J 2/447; B41J 11/002
See application file for complete search history.

(56) References Cited

U.S. PATENT DOCUMENTS

2008/0204488 A1* 8/2008 Usui .................... B41J 2/17513
347/7

FOREIGN PATENT DOCUMENTS

| JP | 2008-028005 A | 2/2008 |
|---|---|---|
| JP | 2008-244165 A | 10/2008 |
| JP | 2011-108925 A | 6/2011 |
| JP | 2011-143626 A | 7/2011 |
| JP | 2014-165333 A | 9/2014 |

* cited by examiner

*Primary Examiner* — Jason S Uhlenhake
(74) *Attorney, Agent, or Firm* — Volpe and Koenig, P.C.

(57) ABSTRACT

There are provided a light irradiation device and a light irradiation system which are capable of correcting changes in optical power output. A light irradiation device includes: a substrate having an upper surface provided with a first recess and a second recess; a light-emitting element located in the first recess, the light-emitting element emitting ultraviolet light; and a detecting element located in the second recess, the detecting element being capable of detecting ultraviolet light.

11 Claims, 7 Drawing Sheets

LIGHT IRRADIATION DEVICE AND LIGHT IRRADIATION SYSTEM

TECHNICAL FIELD

The present invention relates to a light irradiation device and a light irradiation system which can be used for the curing of ultraviolet cure resin, paint, etc.

BACKGROUND ART

By way of one example of light irradiation devices, an ultraviolet irradiation device has been used for general purposes, including fluorescence reaction observations in the field of medicine or biotechnology, disinfection, the adhesion of electronic components, and the curing of ultraviolet cure resin and ink (refer to Patent Literature 1, for example).

However, the light irradiation device may undergo changes in performance capabilities, such as a drop in optical power output, with the accumulation of irradiation time. Due to the accumulation of irradiation time, for example, the above-described curing may not complete successfully, causing incomplete curing, or the necessity of readjustment of curing conditions may arise. This has created demands for a light irradiation device capable of correcting changes in optical power output caused by the accumulation of irradiation time, for example.

CITATION LIST

Patent Literature

Patent Literature 1: Japanese Unexamined Patent Publication JP-A 2008-244165

SUMMARY OF INVENTION

A light irradiation device according to an embodiment of the invention comprises: a substrate having an upper surface provided with a first recess and a second recess; a light-emitting element located in the first recess, the light-emitting element emitting ultraviolet light; and a detecting element located in the second recess, the detecting element being capable of detecting ultraviolet light.

A light irradiation system according to an embodiment of the invention comprises: the light irradiation device mentioned above; a constant current control section which produces a constant current for driving the light irradiation device; and a driving current computing section which computes a current value of the constant current based on a result of ultraviolet detection by the detecting element, and outputs the current value to the constant current control section.

A light irradiation system according to an embodiment of the invention comprises: the light irradiation device mentioned above; a constant current control section which produces a constant current for driving the light irradiation device; and an abnormality determination section which determines that the light irradiation device is abnormal when a result of infrared detection by the detecting element is out of a predetermined range.

BRIEF DESCRIPTION OF DRAWINGS

FIGS. 1A and 1B are views showing a principal part of a light irradiation device in accordance with an embodiment of the invention, wherein FIG. 1A is a plan view and FIG. 1B is a side view;

FIGS. 3A and 3B are views for explaining a light irradiation system comprising the light irradiation device shown in FIGS. 1A and 1B, wherein FIG. 3A is a block diagram and FIG. 3B is a flow chart showing a driving procedure;

FIGS. 4A and 4B are views for explaining the light irradiation system comprising a modified example of the light irradiation device shown in FIGS. 1A and 1B, wherein FIG. 4A is a block diagram and FIG. 4B is a flow chart showing a driving procedure;

DESCRIPTION OF EMBODIMENTS

Now reference to the drawings, exemplifications of a light irradiation device and a printer in accordance with an embodiment of the invention will be described below. It is to be understood that the following is considered as illustrative only of the embodiment of the invention, and the application of the invention is not limited to the following forms of the embodiment.

(Light Irradiation Device)

Figure 1A:
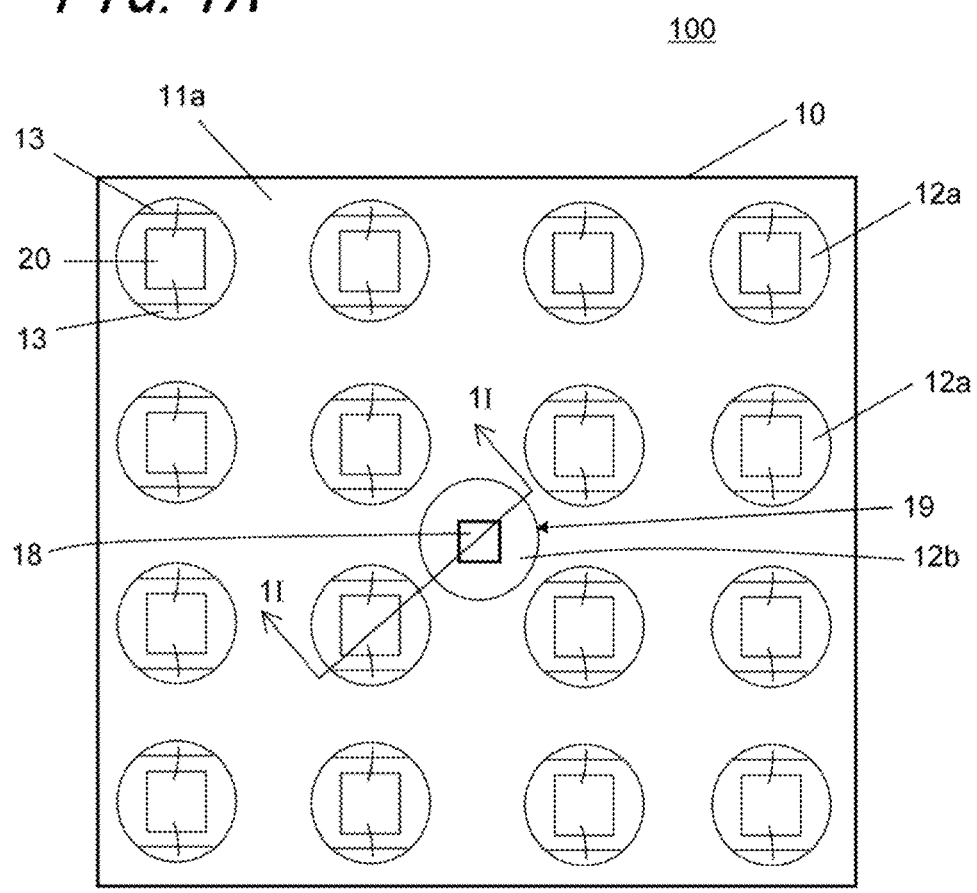
Figure 1B:
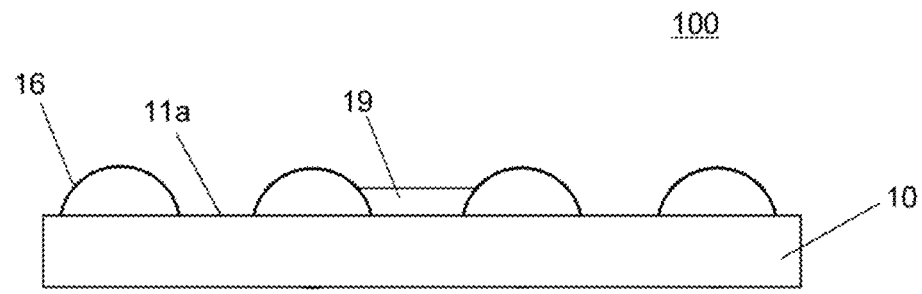
Figure 2:
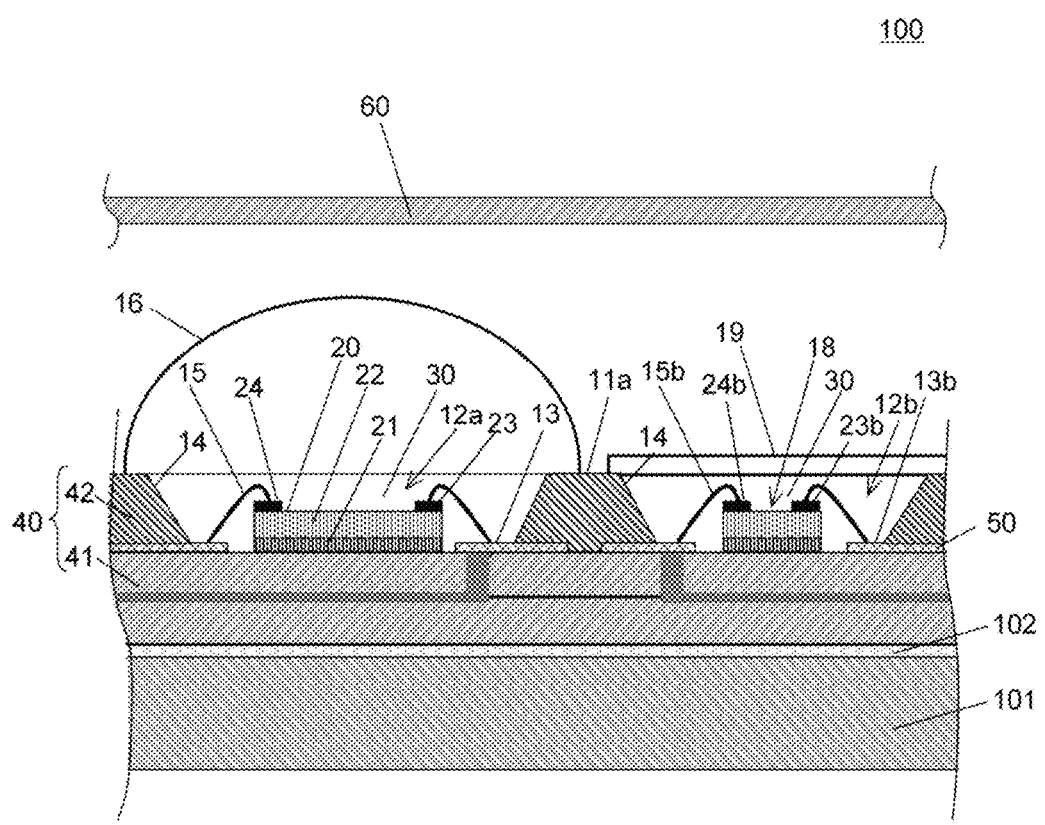
FIG. 2 is a sectional view of the light irradiation device taken along the line 1I-1I shown in FIGS. 1A and 1B.

For example, a light irradiation device 100 according to an embodiment of the invention as shown in FIGS. 1A to 2 is incorporated into an ultraviolet curable ink-using printer, such as an offset printer or an ink-jet printer, so as to serve as an ultraviolet-emitting light source which applies ultraviolet light to an ultraviolet curable ink which has adhered to a target object (recording medium) to cure the ultraviolet curable ink.

The light irradiation device 100 comprises: a substrate 10 having an upper surface (one principal surface) 11a provided with a plurality of recesses (openings) 12, including a first recess 12a and a second recess 12b; a light-emitting element 20 located in the first recess 12a, the light-emitting element 20 emitting ultraviolet light; and a detecting element 18 located in the second recess 12b, the detecting element 18 being capable of detecting ultraviolet light. As shown in FIGS. 1A and 1B, the irradiation device 100 is provided with a plurality of the first recesses 12a, and a plurality of the light-emitting elements 20 are arranged correspondingly. Similarly, a plurality of the second recesses 12b may be provided, and a plurality of the detecting elements 18 are arranged correspondingly, or, alternatively, as shown in FIGS. 1A and 1B, a single second recess 12b is provided, and a single detecting element 18 is arranged correspondingly.

Moreover, the light irradiation device 100 may comprise: a plurality of connection pads 13 each disposed inside the recess 12; a plurality of light-emitting elements 20 each disposed inside the recess 12 of the substrate 10, the plurality of light-emitting elements 20 being electrically connected to the connection pads 13, respectively; and a plurality of sealing materials 30 each disposed so as to fill the recess 12, the plurality of sealing materials covering the plurality of light-emitting elements 20, respectively.

The light irradiation device 100 may further comprise: an ultraviolet shield member 19 which covers a detecting element 18a in a state of being apart therefrom; and a lens 16 which covers the light-emitting element 20 in a state of being apart therefrom. Moreover, as shown in FIG. 2, the light irradiation device 100 may be provided with a light-transmitting member 60 spaced away from each of the constituent components, the light-transmitting member 60 allowing the exit of light emitted from the light-emitting element 20.

As shown in FIG. 2, the light irradiation device 100 may be provided with a heat-dissipating member 101 joined to a lower side of the light irradiation device 100 via an adhesive material 102 such as silicone resin, epoxy resin, or solder. The heat-dissipating member 101 serves as a support for a stacked body 40, and serves also as a heat dissipator for dissipating heat emanating from the light-emitting element 20 into the outside. As the material for forming the heat-dissipating member 101, a material having high heat conductivity is usable. Examples of the material for forming the heat-dissipating member 101 include various types of metal materials, ceramics, and resin materials. The heat-dissipating member 101 of this example is formed of copper.

The following describes the details of each constituent component.

The substrate 10 comprises: a stacked body 40 in which a first insulating layer 41 and a second insulating layer 42 are laminated; and an electrical wiring 50 for providing connection between the light-emitting elements 20. The substrate 10 is rectangular in a plan view from above the one principal surface 11a, and, the light-emitting element 20 is supported inside the recess 12 (the first recess 12a) provided in the one principal surface 11a.

For example, the first insulating layer 41 is formed of ceramics such as an aluminum oxide sintered body, an aluminum nitride sintered body, a mullite sintered body, or glass ceramics, or a resin such as epoxy resin or a liquid crystal polymer (LCP).

The electrical wiring 50 is formed in a predetermined pattern from an electrically conductive material such for example as tungsten (W), molybdenum (Mo), manganese (Mn), or copper (Cu). The electrical wiring 50 serves as a feeder wiring for supplying current to the light-emitting element 20 or current from the light-emitting element 20.

The second insulating layer 42 laminated on the first insulating layer 41 has the recess 12 formed therethrough as an opening.

Each recess 12 has an inner circumferential surface 14 inclined so that a hole diameter is larger on a side corresponding to the one principal surface 11a of the substrate 10 than on a side corresponding to a placement surface for the light-emitting element 20, and, for example, the recess 12 is circular in a plan view. The opening shape is not limited to the circular shape, but may be of a rectangular shape.

Such a recess 12 allows the light emitted from the light-emitting element 20 to be reflected upwardly by the inner circumferential surface 14, and thus serves to achieve an increase in light-taking efficiency.

For the purpose of attaining greater light-taking efficiency, it is advisable to form the second insulating layer 42 of a porous ceramic material which exhibits a relatively good reflectivity to light in the ultraviolet range, such for example as an aluminum oxide sintered body, a zirconium oxide sintered body, or an aluminum nitride sintered body.

These recesses 12 are arranged in rows and columns in a square lattice pattern over the entire area of the one principal surface 11a of the substrate 10. For example, the recesses 12 may be placed in a staggered arrangement, expressed differently, the recesses 12 may be arranged in zigzag form in two or more rows. Such an arrangement allows the light-emitting elements 20 to be placed with higher packing density, thus increasing the degree of irradiance per unit area. As used herein, placing the recesses in the staggered arrangement may be taken to mean placing the recesses in positions corresponding to lattice points of a rhombic lattice pattern.

The substrate 10 mentioned above which comprises the stacked body 40 composed of the first insulating layer 41 and the second insulating layer 42 is, when the first insulating layer 41 and the second insulating layer 42 are formed of ceramics, etc., produced by following such procedural steps as given below.

First, a plurality of ceramic green sheets produced by a heretofore known method are prepared. Holes equivalent to the recess 12 are formed in a ceramic green sheet corresponding to the second insulating layer 42 by means of punching or otherwise. Then, after printing a metallic paste for forming the electrical wiring 50 onto a ceramic green sheet corresponding to the first insulating layer 41, the ceramic green sheet corresponding to the second insulating layer 42 is laminated on that ceramic green sheet so that the printed metallic paste lies between these green sheets. As the metallic paste for forming the electrical wiring 50, for example, it is possible to use a paste containing a metal such as tungsten (W), molybdenum (Mo), manganese (Mn), or copper (Cu). Next, the laminated body, namely, the green sheets and the metallic paste are fired together at one time, whereupon the formation of the substrate 10 having the electrical wiring 50 and the recesses 12 is completed.

Moreover, when the first insulating layer 41 and the second insulating layer 42 are formed of resin, for example, the following method can be adopted for the production of the substrate 10.

First, precursor sheets of thermosetting resin are prepared. Next, a lead terminal which constitutes the electrical wiring 50 and is formed of a metal material is interposed between the precursor sheets, and, the plurality of precursor sheets are stacked together so that the lead terminal can be embedded in the precursor sheets. As the material for forming the lead terminal, for example, it is possible to use a metal material such as copper (Cu), silver (Ag), aluminum (Al), an iron (Fe)-nickel (Ni)-cobalt (Co) alloy, or an iron (Fe)-nickel (Ni) alloy. Then, after forming holes equivalent to the recess 12 in the precursor sheets by means of laser processing, etching, or otherwise, the precursor sheets are cured under heat, whereupon the formation of the substrate 10 is completed. In the case of forming the recess by laser processing, the recess-forming operation may be effected after curing the precursor sheets under heat.

Meanwhile, inside the recess 12 of the substrate 10, there are provided the connection pad 13 electrically connected to the light-emitting element 20, the light-emitting element 20 connected to the connection pad 13 via a joining material 15 such as solder, a gold (Au) wire, or an aluminum (Al) wire, the sealing material 30 for sealing the light-emitting element 20, the detecting element 18, etc.

The connection pad 13 is formed by a metallic layer formed of a metal material such for example as tungsten (W), molybdenum (Mo), manganese (Mn), or copper (Cu). On an as needed basis, for example, a nickel (Ni) layer, a palladium (Pd) layer, or a gold (Au) layer may additionally be laminated on the metallic layer. Such a connection pad 13 is connected to the light-emitting element 20 via the joining material 15 such as solder, a gold (Au) wire, or an aluminum (Al) wire.

Moreover, the light-emitting element 20 is constructed of, for example, a light-emitting diode obtained by laminating an n-type semiconductor layer and a p-type semiconductor layer formed of a semiconductor material such as gallium arsenide (GaAs) or gallium nitride (GaN) on an element substrate 21 such as a sapphire substrate, or an organic EL (electroluminescence) element having an organic material-made semiconductor layer.

The light-emitting element 20 comprises: a semiconductor layer 22 having a light-emitting layer; and element electrodes 23 and 24 formed of a metal material such as silver (Ag), which are each connected, via the joining material 15 such as solder, a gold (Au) wire, or an aluminum (Al) wire, to the connection pad placed on the substrate 10, and thus, the light-emitting element 20 is connected to the substrate 10 by wire bonding. In response to the current flowing between the element electrodes 23 and 24, the light-emitting element 20 emits light having a predetermined wavelength at a predetermined luminance. Note that the element substrate 21 may be omitted from the construction. Moreover, the connection between the element electrode 23, 24 of the light-emitting element 20 and the connection pad 13 may be established by the heretofore known flip-chip bonding technique using, for example, solder as the joining material 15.

In this exemplification, as the light-emitting element 20, there is used an LED (light emitting diode) which emits ultraviolet light in a light emission spectrum with peak wavelengths ranging from 280 nm to 440 nm, for example. That is, in this example, a UV-LED (ultraviolet-light emitting diode) element is adopted for use as the light-emitting element 20. The light-emitting element 20 is formed by a heretofore known thin-film forming technique.

The sealing material 30 seals the light-emitting element 20.

An insulating material, such as a highly light-transmitting resin material, is used for the sealing material 30. The sealing material 30 sealing the light-emitting element 20 provides protection for the light-emitting element 20 by preventing intrusion of external moisture or absorbing external impact.

Moreover, as the sealing material 30, the use of a material having a refractive index which falls in between the refractive index of the element substrate 21 constituting the light-emitting element 20 (a refractive index of 1.7 in the case of a sapphire substrate) and the refractive index of air (a refractive index of about 1.0), for example, a silicone resin having a refractive index of about 1.4, makes it possible to increase the light-taking efficiency of the light-emitting element 20.

Such a sealing material 30 is formed by, after mounting the light-emitting element 20 on the substrate 10, filling the recess 12 with a precursor of, for example, silicone resin, and thereafter curing the resin precursor.

The light-transmitting member 60, which serves to provide protection for each constituent component, may be formed of a glass material, for example.

As the detecting element 18 (18a), it is possible to use any one of elements capable of detecting ultraviolet light emitted from the light-emitting element 20, and, examples of such an element include a photodiode.

The light irradiation device 100 may be configured so that the detecting element 18 (18a) can detect ultraviolet light which is emitted from the light-emitting element 20 and is transmitted through the substrate 10. More specifically, as shown in FIGS. 1A to 2, the thickness of a part of the substrate 10 which part lies between the first recess 12a and the second recess 12b may be adjusted to a predetermined extent that would permit transmission of the ultraviolet light so that ultraviolet light from the light-emitting element 20 located in the first recess 12a reaches the second recess 12b. In other words, the first recess 12a and the second recess 12b may be arranged so that the distance between them is shorter than the distance between the adjacent first recesses 12a, and the thickness of a part of the substrate 10 which part defines the spacing between the first recess 12a and the second recess 12b may be adjusted to be smaller than the thickness of a part thereof which lies between the adjacent first recesses 12a.

Moreover, in the present embodiment, as the detecting element 18a, it is possible to use an element capable of detecting infrared light. For example, in cases where the light emitted from the light-emitting element 20 is absorbed by foreign matter such as ink or resin adhered to the surface of the light-transmitting member 60 with the consequence that infrared light emanates from the foreign matter and the surface of the light-transmitting member 60 acting as heat sources, the detection of the infrared emission by such an element makes it possible to suppress occurrence of damage to the light-transmitting member 60 or decrease in optical power output.

Moreover, the detecting element 18a comprises electrodes 23b and 24b formed of a metal material such as silver (Ag). The electrodes 23b and 24b are each connected, via a joining material 15b such as solder, a gold (Au) wire, or an aluminum (Al) wire, to a connection pad 13b placed on the substrate 10. In this example, the detecting element 18a is connected to the substrate 10 by wire bonding.

The ultraviolet shield member 19 is capable of effectively blocking incoming ultraviolet light from the upper surface (one principal surface) 11a side. As the ultraviolet shield member 19, it is possible to use a member composed of glass having a vapor-deposited ultraviolet-blocking material on a surface thereof. As shown in FIGS. 1A to 2, the ultraviolet shield member 19 may be formed so as to close the opening of the second recess 12b. With this arrangement, ultraviolet light emitted from the light-emitting element 20 is detected by the detecting element 18a in a highly selective manner, which makes it possible to ascertain whether the light-emitting element 20 maintains the intensity of irradiation at an adequate level. In consequence, correction can be made to variations in optical power output caused by the accumulation of irradiation time, for example.

Moreover, as the ultraviolet shield member 19, it is possible to use a member transmitting infrared light. In this case, as described previously, the infrared light emanating from the surface of the light-transmitting member 60 can be detected by the detecting element 18 located inside the second recess 12b, which makes it possible to suppress occurrence of damage to the light-transmitting member 60 or decrease in optical power output.

The lens 16 is not particularly limited as long as it is a lens capable of effective emission of light applied by the light-emitting element 20, and, as shown in FIGS. 1A to 2, the lens 16 may be formed so as to close the opening of the first recess 12a.

<Light Irradiation System>

Figure 3A:
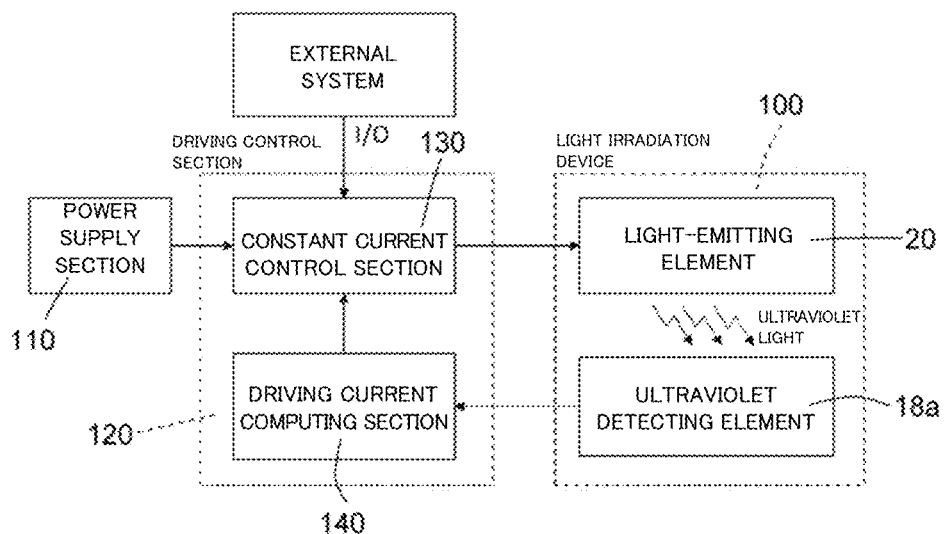
Figure 3B:
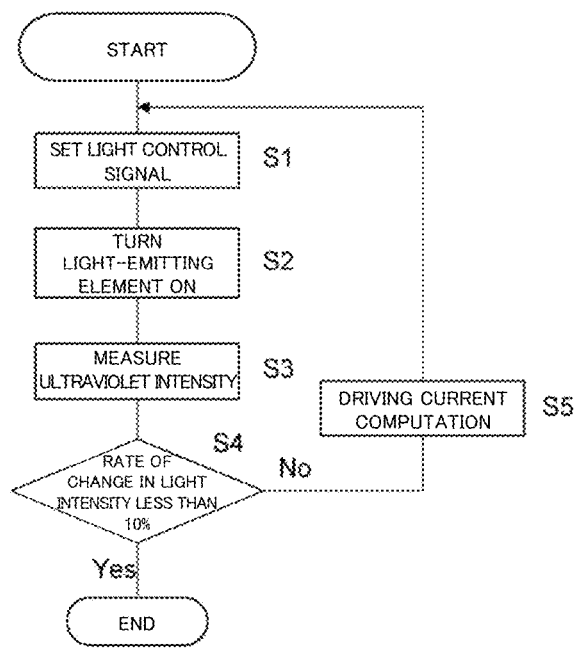

The following describes a light irradiation system including the described light irradiation device 100 according to the embodiment of the invention with reference to FIGS. 3A and 3B.

The light irradiation system comprises the light irradiation device 100 (including the light-emitting element 20 and the detecting element 18), a power supply section 110, a constant current control section 130, and a driving current computing section 140. The following description deals with, as the detecting element 18, the detecting element 18a capable of detecting ultraviolet light emitted from the light irradiation device 100. In what follows, the constant current control section 130 and the driving current computing section 140 may also be collectively called a driving control section 120.

(Light Irradiation Device 100)

The details of the light irradiation device 100 can be understood from the foregoing description.

The light-emitting element 20 emits light in response to a current outputted from the constant current control section 130.

The detecting element 18a, which is connected to the constant current control section 130 and the driving current computing section 140, detects ultraviolet light emitted from the light-emitting element 20. A current responsive to the intensity of the detected ultraviolet light is outputted to the driving current computing section 140.

(Power Supply Section 110)

For example, the power supply section 110 produces a direct-current (DC) voltage from an alternating-current (AC) voltage, and inputs the DC voltage to the constant current control section 130. Moreover, the magnitude of the DC voltage at the power supply section 110 is adjusted to be greater than a value obtained by adding the load voltage at the constant current control section 130 to the forward voltage (Vf) at the light irradiation section.

(Constant Current Control Section 130)

The constant current control section 130 produces a constant current for driving the light irradiation device 100. For example, in the present embodiment, the constant current control section 130 is connected to the power supply section 110 and the light irradiation device 100. In response to a predetermined voltage from the power supply section 110, the constant current control section 130 produces a predetermined current and supplies the current to the light irradiation device 100, thus allowing the light-emitting element 20 to emit light.

(Driving Current Computing Section 140)

The driving current computing section 140, which is connected to the detecting element 18a and the constant current control section 130, receives an output signal from the detecting element 18a and converts the signal into optical power output data. On the basis of the difference between the optical power output data and a target optical power output value stored in a memory, the driving computing section 140 performs computations to derive a value of driving current which is supplied from the constant current control section 130 to the light irradiation device 100, and outputs the driving current value to the constant current control section 130.

(External System)

Examples of an external system which is connected to the light irradiation device 100 include a printer. In FIGS. 3A and 3B, the external system is connected, via the constant current control section 130, to the light irradiation device 100. The external system outputs ON/OFF signals at the light irradiation device 100 to the constant current control section 130, and also, when receiving an actuating signal or an abnormal signal from the constant current control section 130, the external system allows the signal to be reflected in the driving data.

<Driving Flow of Light Irradiation System>

The following describes the driving flow of the light irradiation system including the light irradiation device 100 thus far described with reference to FIG. 3B.

(i) In order to obtain desired optical power output from the light irradiation device 100, a predetermined current is outputted from the constant current control section 130 to the light irradiation device 100 (Step S1). That is, "SET LIGHT CONTROL SIGNAL" refers to setting (inputting) of an output current value for a driving circuit. This operation allows the determination of the current corresponding to the irradiation-ON state. Thence, a driving of the light irradiation device 100 is started (Step S2).

(ii) Ultraviolet light is detected by the detecting element 18a continuously or at predetermined time periods (Step S3). In this step, for example, the intensity of ultraviolet light is measured.

(iii) When the value of an output signal from the detecting element 18a is lower than an initial value, then it is determined that the value of optical power output from the light irradiation device 100 is lower than the initial value. When it is determined in Step S4 that there is a 10% or more decrease in optical power output with respect to the initial value, or equivalently, the rate of change of optical power output with respect to the initial value is not less than 10% ("No" in Step S4), then the procedure proceeds to Step S5 where the driving current computing section 140 calculates the value of a current which is supplied from the constant current control section 130 to the light irradiation device 100 for a reset of the optical power output to the initial value. The magnitude of the current outputted from the constant current control section 130 is increased so that the current thus calculated by the driving current computing section 140 can be supplied from the constant current control section 130 to the light irradiation device 100. This makes it possible to reset the value of optical power output from the light irradiation device 100 to the initial value.

(iv) On the other hand, when it is determined that the rate of change of optical power output with respect to the initial value is less than 10% ("Yes" in Step S4), then the value of the current to be supplied from the constant current control section 130 to the light irradiation device 100 remains unchanged.

(v) With a repetition of the procedural steps (i) through (iv) thus far described, even if the value of optical power output becomes lower than the initial value due to, for example, the accumulation of irradiation time, the value of optical power output can be repeatedly reset to the initial value.

As described heretofore, in the light irradiation device 100 according to the present embodiment, during continuous driving thereof, the value of the current to be outputted from the constant current control section 130 to the light irradiation device 100 can be changed in response to a change of a signal based on the detected ultraviolet radiation. This makes it possible to suppress the decrease in optical power output in the light irradiation device 100 caused by the accumulation of irradiation time, etc.

(Modified Example)

Figure 4A:
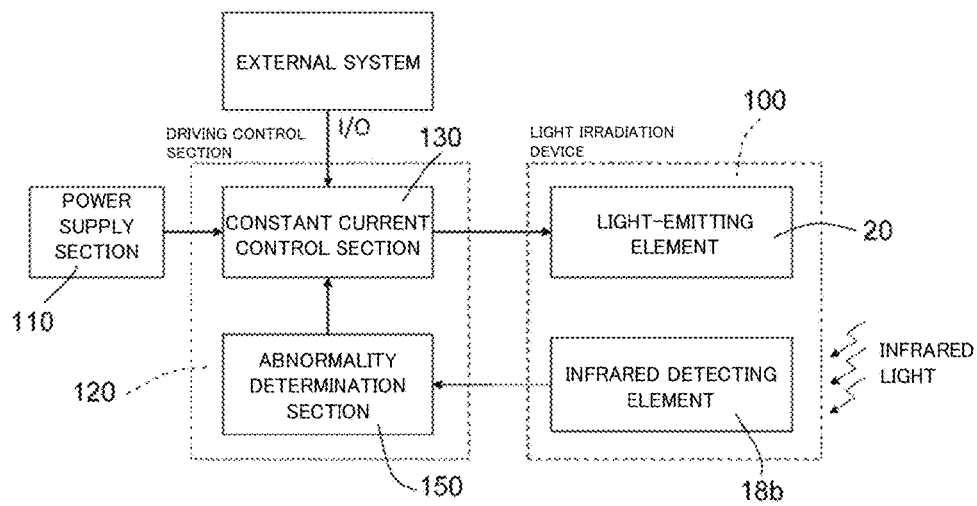
Figure 4B:
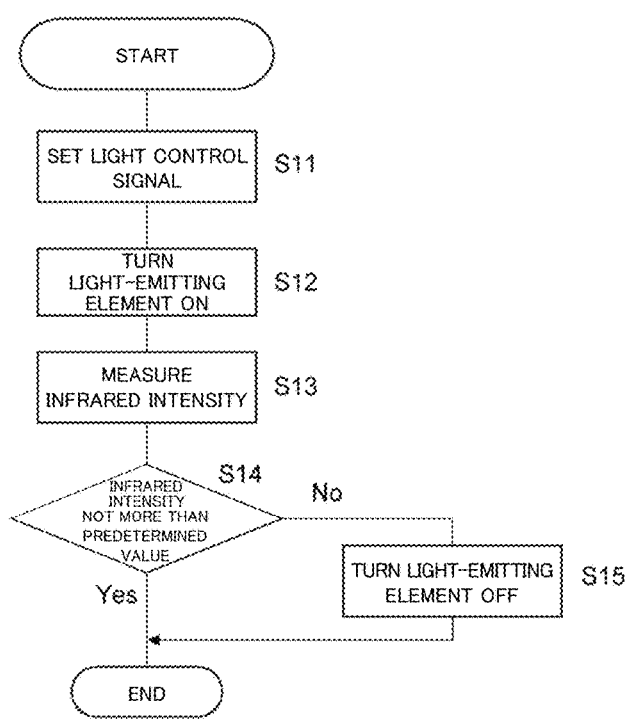

The following describes modified examples in the light irradiation system and in the driving flow of the light irradiation system with reference to FIGS. 4A and 4B.

In the modified example, the light irradiation system comprises the light irradiation device 100 (including the light-emitting element 20 and the detecting element 18), the power supply section 110, the constant current control section 130, and an abnormality determination section 150. In this system, as the detecting element 18, a detecting element 18b capable of detecting externally incident infrared light is used.

The detecting element 18*b*, which is connected to the constant current control section 130 and the abnormality determination section 150, detects externally incident infrared light.

The abnormality determination section 150 receives an output signal from the detecting element 18*b* and converts the signal into output data. On the basis of comparison between the output data and an allowable output range stored in a memory, when the output data is determined to be out of the range, then the abnormality determination section 150 issues an OFF signal to the constant current control section 130 to disable the current to be outputted to the light irradiation device 100.

<Driving Flow of Light Irradiation System>

The following describes the driving flow of the light irradiation system including the light irradiation device 100 according to the modified example with reference to FIG. 4B.

(i) In order to obtain desired optical power output from the light irradiation device 100, a predetermined current is outputted from the constant current control section 130 to the light irradiation device 100 (Step S11). Thence, driving of the light irradiation device 100 is started (Step S12).

(ii) Infrared light is detected by the detecting element 18*b* continuously or at predetermined time periods (Step S13). In this step, for example, the intensity of the infrared light is measured.

(iii) When the value of an output signal from the detecting element 18*b* is more than a predetermined value, then it is determined that foreign matter such as ink or resin adhered to the surface of the light-transmitting member 60, etc. emits infrared light. When it is determined in Step S14 that the value of the output signal from the detecting element 18*b* is more than the predetermined value ("No" in Step S14), then the procedure proceeds to Step S15 where the current to be outputted to the light irradiation device 100 is disabled to suspend light emission from the light-emitting element 20. Thus, detecting infrared emission from foreign matter makes it possible to suspend light emission from the light-emitting element under abnormal conditions, and suppress the damage to the light-transmitting member 60, etc.

(iv) On the other hand, when it is determined that the value of the output signal from the detecting element 18*b* is not more than the predetermined value ("Yes" in Step S14), then the light-emitting element 20 is operated to continue light emission.

(v) A repetition of the procedural steps (i) through (iv) thus far described makes it possible to detect adhesion of foreign matter such as ink or resin to the surface of the light-transmitting member 60, etc., and suppress the damage to the light-transmitting member 60, etc.

(Printer)

Figure 5A:
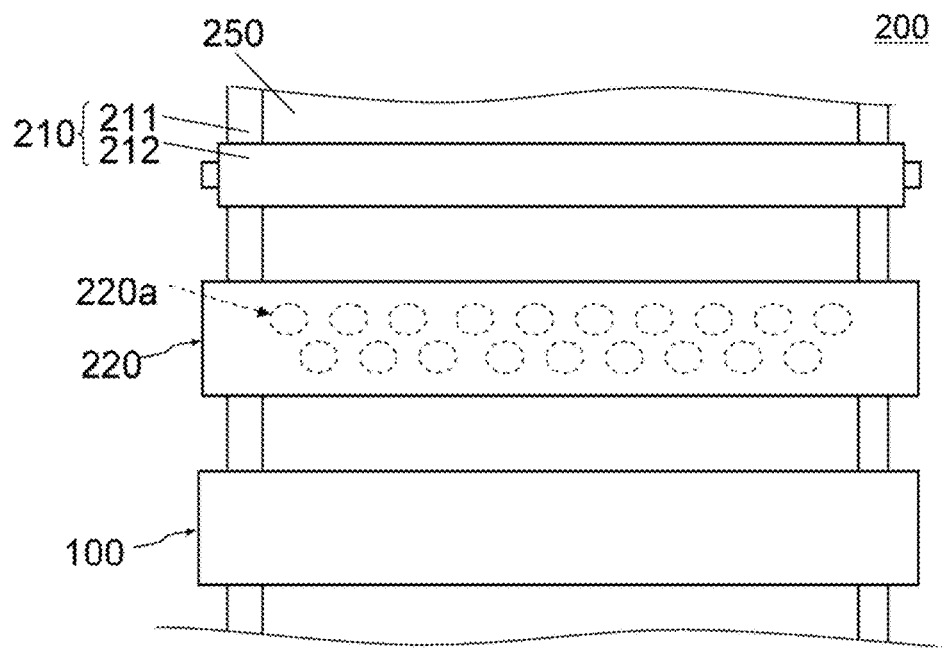
FIG. 5A is a top view of a printer employing the light irradiation device shown in FIGS. 1A and 1B.
Figure 5B:
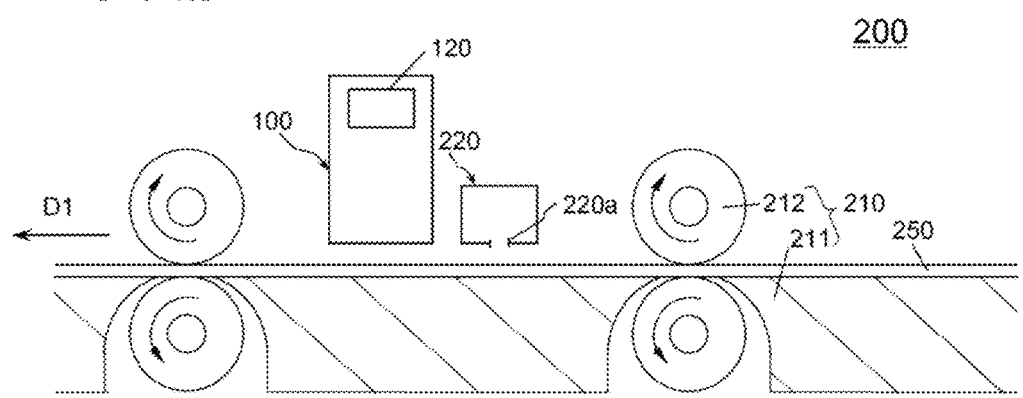
FIG. 5B is a sectional view of the printer shown in FIG. 5A.

The following describes a printer 200 as shown in FIGS. 5A and 5B which is an example of the printer according to the embodiment of the invention.

The printer 200 comprises: conveying means 210 for conveying a recording medium 250; printing means 220 serving as a printing mechanism for performing printing on the recording medium 250 under conveyance; the light irradiation device 100 mentioned above, for applying ultraviolet light to the recording medium 250 which has undergone printing process; and a driving control section 120 for controlling light emission from the light irradiation device 100. The recording medium 250 is equivalent to the earlier described target object.

The conveying means 210 serves to convey the recording medium 250 so as to cause it to pass through the printing means 220 and the light irradiation device 100 sequentially in the order named. The conveying means 210 comprises: a placement table 211; and a pair of conveying rollers 212 arranged to face each other, the pair of conveying rollers 212 being rotatably supported. The conveying means 210 feeds the recording medium 250 supported by the placement table 211 into between the pair of conveying rollers 212, and rotates the conveying rollers 212, thus allowing the recording medium 250 to travel in the conveyance direction.

The printing means 220 serves to adhere a photosensitive material to the recording medium 250 conveyed via the conveying means 210. The printing means 220 is configured to discharge droplets containing the photosensitive material toward the recording medium 250 for adhering the photosensitive material to the recording medium 250. In this example, an ultraviolet curable ink is used as the photosensitive material. Examples of the photosensitive material include, in addition to the ultraviolet curable ink, a photosensitive resist and a photocurable resin.

In this example, line-type printing means is used as the printing means 220. The printing means 220 has a plurality of discharge holes 220*a*, which are arranged in a line (a straight line), so that the ultraviolet curable ink can be discharged from the discharge holes 220*a*. The printing means 220 performs printing on the recording medium by discharging the ink from the discharge holes 220*a* so that the ink is directed to and adheres to the recording medium 250 which is being conveyed in a direction perpendicular to the arrangement direction of the discharge holes 220*a*.

Although the line-type printing means is exemplified as the printing mechanism in this example, the printing mechanism is not limited to this, and may be of serial-type printing means, and also, the head is not limited to a discharge head, and may be of a line-type or serial-type spraying head (for example, ink-jet head). Moreover, as the printing mechanism, an electrostatic mechanism may be adopted in which static electricity is caused to accumulate on the recording medium 250 to adhere the electrically charged photosensitive material to the recording medium 250 by the electrostatic force, or an immersion mechanism may be adopted in which the recording medium 250 is immersed in a photosensitive material in liquid form to adhere the photosensitive material to the recording medium 250. In another alternative, as the printing mechanism, a mechanism including a brush, a roller, etc may be adopted.

In the printer 200, the light irradiation device 100 serves to expose the photosensitive material adhered to the recording medium 250 conveyed via the conveying means 210 to light. The light irradiation device 100 is located on a downstream side in the conveyance direction of the printing means 220. Moreover, in the printer 200, the light-emitting element 20 serves to expose the photosensitive material adhered to the recording medium 250 to light.

The driving control section 120 serves to control light emission from the light irradiation device 100. A storage portion (memory) of the driving control section 120 stores information indicative of the characteristics of such light as allows ink droplets discharged from the printing means 220 to cure relatively satisfactorily. Specific examples of the information stored in the memory include, in addition to information about signals related to optical power output as described above, wavelength distribution characteristics and light emission intensity (light emission intensity in each wavelength range) suited to the curing of discharged ink droplets. In the printer 200 according to the present embodiment, by virtue of the driving control section 120, the magnitude of a driving current which is inputted to each of the plurality of light-emitting elements 20 can be adjusted on the basis of the information stored in the driving control section 120. Thus, the printer 200 according to the present embodiment can achieve application of light with adequate ultraviolet irradiation energy conforming to the characteristics of an ink in use, and hence can cure ink droplets with light of relatively low energy.

In this printer 200, the conveying means 210 conveys the recording medium 250 in the conveyance direction. The printing means 220 discharges an ultraviolet curable ink toward the recording medium 250 under conveyance to adhere the ultraviolet curable ink to the surface of the recording medium 250. At this time, the ultraviolet curable ink which adheres to the recording medium 250 may be subjected to either full adhesion or partial adhesion, or alternatively the ink may be adhered in a predetermined pattern. In this printer 200, the ultraviolet curable ink adhered to the recording medium 250 is irradiated to cure the ultraviolet curable ink with ultraviolet light emitted from the light irradiation device 100.

According to the printer 200 thus far described, the above-described advantageous effects obtained by the light irradiation device 100 can be attained.

Although specific examples of the embodiment of the invention have been shown herein, it is to be understood that the invention is not limited to this, and thus various modifications are possible without departing from the scope of the invention.

For example, the above description deals with the case where the light irradiation device 100 according to the present embodiment is configured so that a single detecting element 18 is capable of detecting infrared light, in addition to ultraviolet light.

Figure 6:
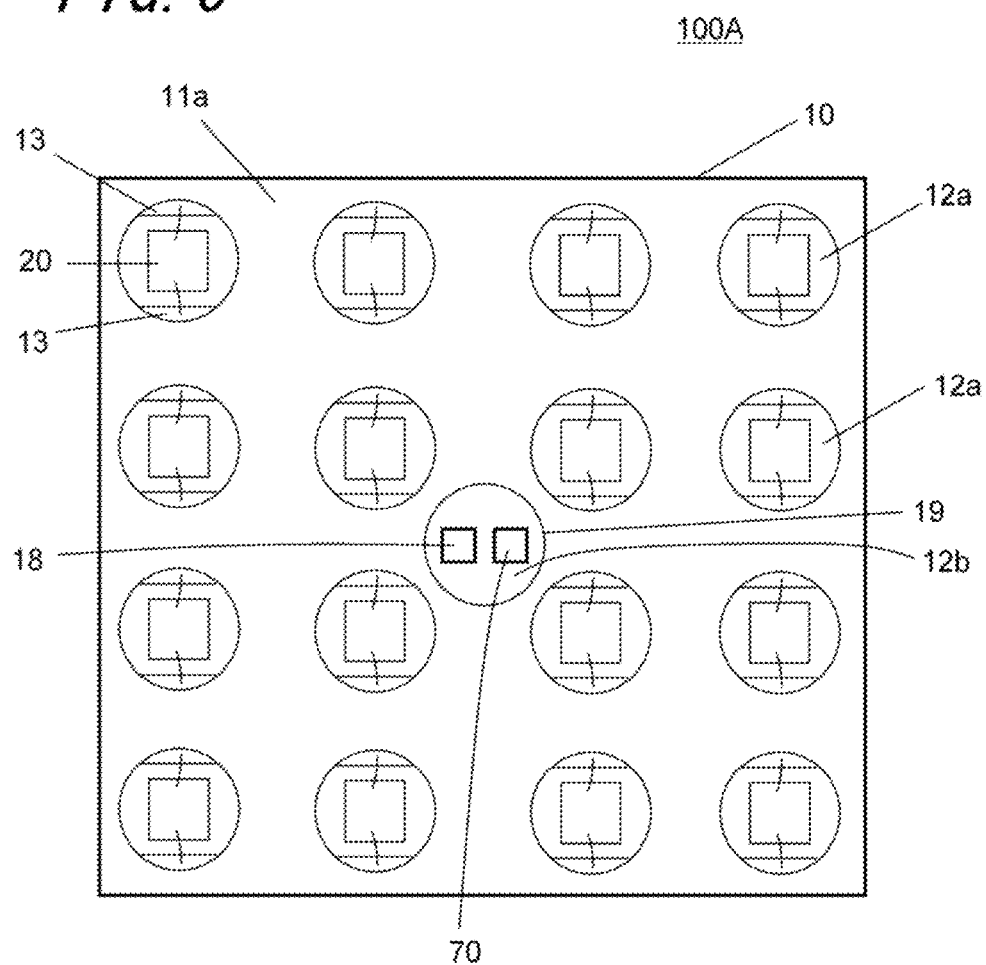
FIG. 6 is a plan view of a modified example of the light irradiation device.

Alternatively, as shown in the plan view of FIG. 6, in a light irradiation device 100A as a modified example, a detecting element 18 capable of detecting ultraviolet light, and a second detecting element 70 capable of detecting infrared light may be provided in the second recess 12b. That is, two detecting elements which detect different detection targets may be placed in a single recess. Also in this case, the same advantageous effects as achieved in the above-described embodiment can be attained.

Figure 7:
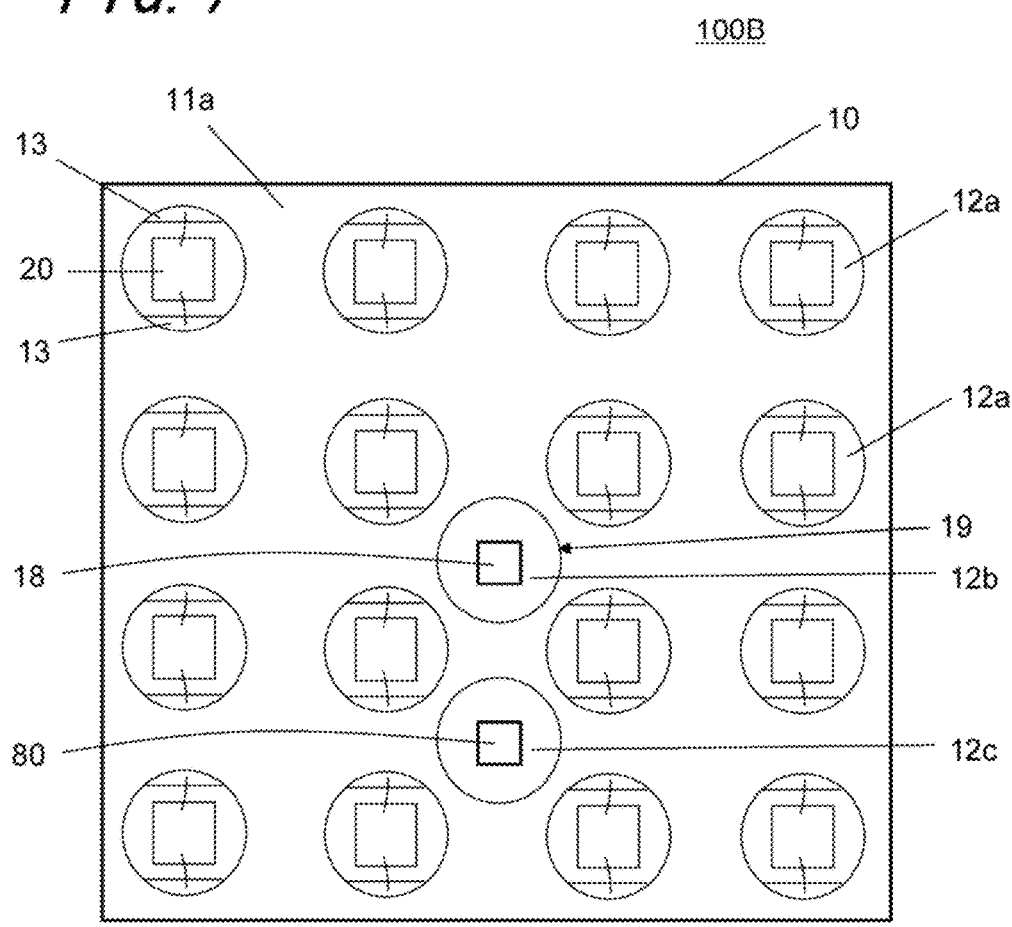
FIG. 7 is a plan view of a modified example of the light irradiation device.

Moreover, as shown in the plan view of FIG. 7, in a light irradiation device 100B as another modified example, a detecting element 18 capable of detecting ultraviolet light is placed in the second recess 12b, and also, a third detecting element 80 capable of detecting infrared light is placed in a third recess 12c formed in the upper surface of the substrate 10. That is, two detecting elements which detect different detection targets may be separately placed in their respective recesses. Also in this case, the same advantageous effects as achieved in the above-described embodiment can be attained.

Next, the embodiment of the printer 200 is not limited to the examples thus far described. For example, the printer 200 may be built as a so-called offset printer in which a roller supported by a shaft is rotated so that a recording medium is conveyed along the surface of the roller. Also in this case, the same advantageous effects can be attained.

Although an example of the above-described embodiment has been described with respect to the case where the light irradiation device 100 is applied to the printer 200 employing an ink-jet head 220, the light irradiation device 100 can find applications in the field of the curing of various types of photocurable resins, for example, it is applicable to a specific-purpose curing apparatus for curing a photocurable resin spin-coated onto the surface of a target object. Moreover, the light irradiation device 100 may be used as an irradiation light source in an exposure unit.

REFERENCE SIGNS LIST

10: Substrate
11a: One principal surface
12: Recess
12a: First recess
12b: Second recess
12c: Third recess
13: Connection pad
14: Inner circumferential surface
15: Joining material
16: Lens
17: Adhesive for Lens
18, 18a, 18b: Detecting element
19: Ultraviolet shield member
20: Light-emitting element
21: Element substrate
22: Semiconductor layer
23, 24: Element electrode
30: Sealing material
40: Stacked body
41: First insulating layer
42: Second insulating layer
50: Electrical wiring
60: Light-transmitting member
70: Second detecting element
80: Third detecting element
100, 100A, 100B: Light irradiation device
101: Heat-dissipating member
102: Adhesive material
110: Power supply section
120: Driving control section
130: Constant current control section
140: Driving current computing section
150: Abnormality determination section
200: Printer
210: Conveying means
211: Placement table
212: Conveying roller
220: Printing means
220a: Discharge hole
250: Recording medium

The invention claimed is:

1. A light irradiation device, comprising:
a substrate having an upper surface provided with a first recess and a second recess;
a light-emitting element located in the first recess, the light-emitting element emitting ultraviolet light;
a detecting element located in the second recess, the detecting element being capable of detecting ultraviolet light that is emitted from the light-emitting element and transmitted through the substrate; and
an ultraviolet shield member which covers the detecting element in a state of being apart therefrom, wherein the ultraviolet shield member closes an opening of the second recess, and is capable of transmitting infrared light.

2. The light irradiation device according to claim 1, wherein the substrate has a portion through which ultraviolet light emitted from the light-emitting element can be transmitted, and the portion is located between the first recess and the second recess.

3. The light irradiation device according to claim 1, further comprising:

a lens which covers the light-emitting element in a state of being apart therefrom.

4. The light irradiation device according to claim 3, wherein the lens closes an opening of the first recess.

5. The light irradiation device according to claim 1, wherein the detecting element is capable of detecting infrared light.

6. A light irradiation system, comprising:
the light irradiation device according to claim 5;
a constant current control section which produces a constant current for driving the light irradiation device; and
an abnormality determination section which determines that the light irradiation device is abnormal when a result of infrared detection by the detecting element is out of a predetermined range.

7. The light irradiation device according to claim 1, further comprising:
a second detecting element which is located in the second recess and is capable of detecting infrared light.

8. The light irradiation device according to claim 1, wherein the upper surface of the substrate is provided with a third recess, and
the light irradiation device further comprises a third detecting element which is located in the third recess and is capable of detecting infrared light.

9. The light irradiation device according to claim 1, further comprising:
a heat-dissipating member joined to a lower surface side of the substrate.

10. A light irradiation system, comprising:
the light irradiation device according to claim 1;
a constant current control section which produces a constant current for driving the light irradiation device; and
a driving current computing section which computes a current value of the constant current based on a result of ultraviolet detection by the detecting element, and outputs the current value to the constant current control section.

11. A light irradiation device, comprising:
a substrate having an upper surface provided with a plurality of first recesses and a second recess;
a light-emitting element located in at least one of the plurality of first recesses, the light-emitting element emitting ultraviolet light;
a detecting element located in the second recess, the detecting element being capable of detecting ultraviolet light that is emitted from the light-emitting element and transmitted through a portion of the substrate; and
an ultraviolet shield member which covers the detecting element in a state of being be apart therefrom, wherein the ultraviolet shield member closes an opening of the second recess, and is capable of transmitting infrared light;
wherein the portion of the substrate is located between the plurality of first recesses and the second recess and the portion of the substrate is smaller in thickness than a second portion of the substrate located between adjacent ones of the plurality of first recesses.

* * * * *